United States Patent [19]

Desai et al.

[11] 4,407,007

[45] Sep. 27, 1983

[54] PROCESS AND STRUCTURE FOR MINIMIZING DELAMINATION IN THE FABRICATION OF MULTI-LAYER CERAMIC SUBSTRATE

[75] Inventors: Kamalesh S. Desai; Carl L. Eggerding, both of Wappingers Falls, N.Y.; John A. Ferrante, Sherman, Conn.; Raymond Ricci, Wappingers Falls; Ernest N. Urfer, Hopewell Junction, both of N.Y.

[73] Assignee: International Business Machines Corporation, Armonk, N.Y.

[21] Appl. No.: 268,044

[22] Filed: May 28, 1981

[51] Int. Cl.³ .................... H01L 23/48; H01L 29/44; H01L 29/52

[52] U.S. Cl. ........................................ 357/74; 357/68; 357/80; 174/68.5

[58] Field of Search .................. 357/71, 80, 74, 82, 357/70, 68; 361/414; 174/68.5

[56] References Cited

U.S. PATENT DOCUMENTS

| | | | |
|---|---|---|---|
| 4,237,606 | 12/1980 | Niwa et al. | 174/68.5 X |
| 4,245,273 | 1/1981 | Feinberg et al. | 357/82 X |
| 4,302,625 | 11/1981 | Hetherington et al. | 174/68.5 |

*Primary Examiner*—Andrew J. James
*Assistant Examiner*—Seth Nehrbass
*Attorney, Agent, or Firm*—Wolmar J. Stoffel

[57] ABSTRACT

A process and a solid plane structure for minimizing delamination during sintering in the fabrication of multi-layer ceramic substrates, wherein the solid plane structure is designed to obtain maximum ceramic to ceramic interface contact.

3 Claims, 3 Drawing Figures

PROCESS AND STRUCTURE FOR MINIMIZING DELAMINATION IN THE FABRICATION OF MULTI-LAYER CERAMIC SUBSTRATE

DESCRIPTION

1. Technical Field

Our invention relates to multi-layer ceramic substrates provided with an internal metallurgy system for use in semiconductor packages, more specifically to an improved process and power plane structure for making a multi-layer ceramic substrate wherein delamination of the ceramic sheets during sintering is minimized or eliminated.

In the fabrication of multi-layer ceramic substrates, green ceramic sheets are punched to form via holes, the holes filled with a conductive paste, a line pattern also imprinted on the surface of each sheet with conductive paste, the ceramic sheets assembled so that the line patterns and filled via holes form an internal metallurgy system, the assembly of sheets pressed and subsequently sintered. During sintering, the organic binders and any other organic material in the green ceramic is burned away, and the ceramic particles fused. The resultant substrate must not crack, or individual sheets separate in order to preserve the integrity of the internal metallurgy system.

2. Background Art

The general technology for fabricating multilayer ceramic substrates is disclosed in an article entitled "A Fabrication Technique for Multi-Layer Ceramic Modules" by H. D. Kaiser, et al in *Solid State Technology*, May 1972, P. 35–40. Improved multi-layer ceramic substrates, and the method of forming same, are described in U.S. Pat. No. 4,245,273, U.S. application Ser. No. 749,482, filed Dec. 10, 1976, U.S. Pat. No. 3,948,706, U.S. application Ser. No. 164,645, filed June 30, 1980, and U.S. Pat. No. 4,024,629.

DISCLOSURE OF INVENTION

The invention is a process for preventing or minimizing partial separation, commonly referred to as delamination, of ceramic sheets during sintering. It has been discovered that sheets with large surface areas of conductive paste are more likely to separate than sheets with limited areas of conductive paste. Solid power planes are used in substrate design where large areas of metallization are required to evenly distribute a voltage potential from the I/O pins to the device power terminals, and also to control impedance in signal line planes. On sheets with large surface areas of conductive paste, the paste pattern configuration has been redesigned to maximize the ceramic-to-ceramic contact between the sheet supporting the metallurgy layer and the overlying ceramic sheet. The metallized area on conventional power plane sheets covered approximately 80% of the sheet, whereas the metallized area of the redesigned sheet is approximately 50% of the sheet. This reduced metallurgy area makes the bond adhesion between the sheets stronger and less likely to delaminate. The redesigned metallurgy pattern retains a substantially solid central area located beneath at least the device or devices on the top surface of the substrate, with broad stripe areas emanating from the central area to power vias located outside the central areas, and providing open areas within the central area which further increase the ceramic to ceramic contact area between sheets.

BRIEF DESCRIPTION OF DRAWINGS

The details of our invention will be described in connection with the accompanying drawings in which.

BEST MODE FOR CARRYING OUT THE INVENTION

Figure 1:
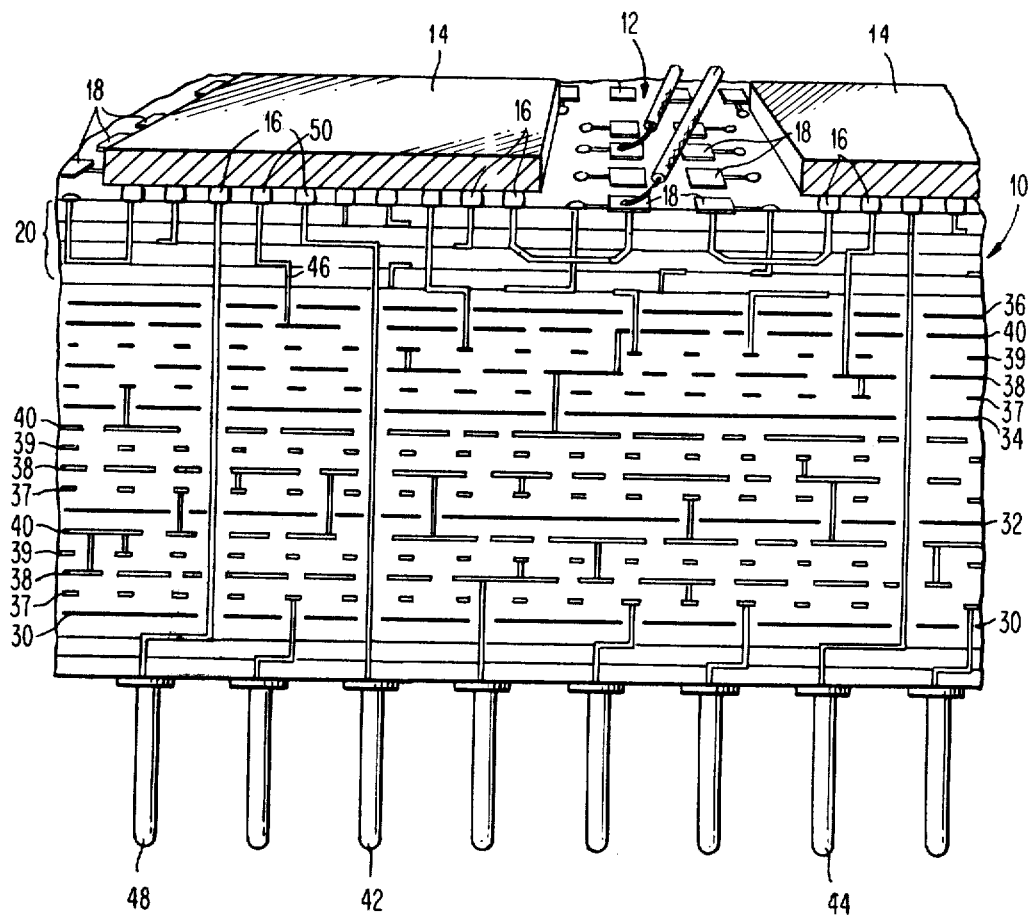
FIG. 1 is a perspective view in broken section of a multi-layer ceramic substrate to which the process of the invention is applicable.

Referring now to FIG. 1, there is shown a cross section of a multi-layer ceramic substrate 10 formed by laminating and sintering a plurality of green ceramic sheets into a monolithic body. On the top surface 12 are mounted 1 or more semiconductor devices 14 connected to a metallurgy pattern, preferably with solder terminals 16. Engineering pads 18 can be provided to interconnect terminals on devices 14 to alter the internal metallurgy or correct for defects in the metallurgy system. Pins on the bottom side of the substrate 10 are adapted to provide electrical connections from the substrate and associated semiconductor devices to external power supplies, input signals, and output terminals.

The internal metallurgy system of substrate 10 is provided to interconnect the input and output terminals of the semiconductor devices mounted on the top surface, provide external connections for input and output signals to and from the overall system, and provide power to operate the semiconductor devices. In general, the several upper layers designated as 20 provide a fanout function that expands the very small spacing geometry of the solder pads on the surface to larger, more workable dimensions. In order to control the impedence of the signal lines in the substrate and also to eliminate cross talk, i.e., mutual inductance between the lines, conductive metallurgy transmitting signals are located between relatively solid conductive planes. As is conventional, conductive lines on a single plane extend only in one direction, i.e., X direction, and lines on the plane below extend only in the orthogonal or Y direction. As indicated in FIG. 1, solid planes 30, 32, 34 and 36 have sandwiched in between them four signal planes 37, 38, 39 and 40. The relatively solid planes 30, 32, 34 and 36 are tied to voltages used to power the devices 14. Note, for example, power pin 42 is connected to power plane 32, power pin 44 is connected to power planes 36 and 30, and power pin 48 is connected to power plane 34. Additional metallurgy lines are provided to interconnect power planes to appropriate power terminals of the devices, as for example, line 46 connects power plane 36 to power terminal 50 of device 14. In like manner, metallurgy lines are provided within the substrate 10 between the various planes to device power terminals to provide power at the various voltage levels of the planes. The power planes are normally connected to more than one power pin to assure a constant voltage level.

Figure 2:
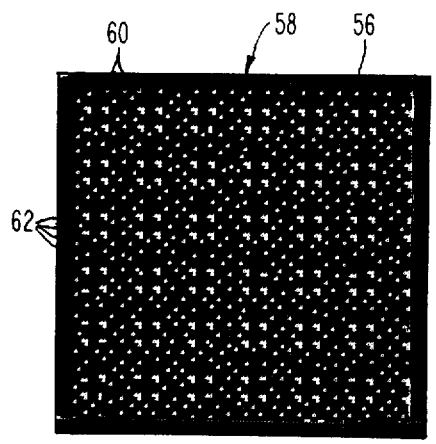
FIG. 2 is a top plan view illustrating the conductive metal pattern on a conventional power plane layer in a multi-layer ceramic substrate.

A typical power plane in a multi-layer ceramic substrate, as practiced in the prior art, has the configuration illustrated in FIG. 2. The pattern 56 covers the major portion of the surface area of the supporting ceramic sheet 58. Open circular areas 60 are provided to permit a line to pass through the sheet, i.e., a via filled with conductive paste, without contacting the plane. Smaller dot areas 62 are interspersed between areas 60. Such planes effectively control impedence of the signal lines and provide a solid, highly conductive, source for providing power of a uniform voltage to power the devices. In the power plane area structure of FIG. 2, approximately 80% of the surface area of the supporting sheet is covered.

It was discovered that when power planes of the type shown in FIG. 2 were used, the multi-layer ceramic substrates exhibited a tendency to delaminate. This separation caused opens in the internal metallurgy system of the substrate that materially reduced the yield and, thereby increased the cost of the product. Also, since the yield loss occurred near the end of the fabrication process, it was very serious since the value of the detective product discarded represented a large expense, as contrasted with defective product or elements thereof detected at an earlier stage of the fabrication process. It was discovered that the strength between ceramic-to-ceramic interface surfaces is approximately three times the strength between ceramic to conductive paste surfaces.

Figure 3:
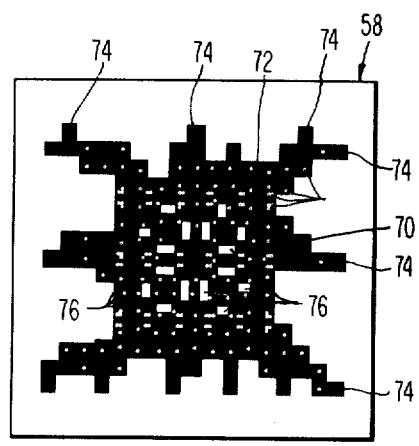
FIG. 3 is a top plan view of a conductive metallurgy pattern on a ceramic sheet for use in the multi-layer ceramic substrate, formed in conformance with the invention.

In FIG. 3 there is depicted a solid plane pattern configuration that embodies the principle of this invention. The conductive plane pattern 70 mounted on a green sheet 58, provided with via holes filled with a conductive metal paste, has a central solid area 72 that, in general, underlies the devices mounted on the top surface of the multilayer ceramic substrate after it is assembled and sintered. The devices are normally mounted in rows and columns above area 72 and spaced inwardly from the edges of the substrate. Also provided are broad stripe areas 74 emanating from central area 72. The configuration of the emanating stripes can vary depending on the device placement and the arrangement of the power pins. The emanating stripes 74 are significantly wider than the conventional lines used in a signal plane pattern. The width must be sufficiently wide to avoid voltage drops in the line when current is passed at levels sufficient to power the devices associated with the power plane patterns. Also included in the central solid area 72 are open areas 76 to further increase the ceramic to ceramic contact area. If possible, the open areas 76 are dispersed in the central area to minimize the area of the paste areas remaining. Dot areas 62 are provided in both the central areas and in the emanating stripes.

In the practice of the improved method of our invention, green ceramic sheets are formed by doctor blading a ceramic slurry that includes a pulverized ceramic material, a binder and a plasticizer. After the slurry has been doctor bladed, it is dried to form a flexible paper-like sheet, as is well known in the art. Via holes are punched in the ceramic sheets, and filled with conductive paste which conventionally includes a refractory metal such as molybdenum or tungsten. An internal metallurgy system in the completed substrate is made up of interconnected conductive plane patterns and power planed patterns on green ceramic sheets assembled into the proper order. It is conventional to arrange the conductive lines joined to vias in an X direction in one layer and in the orthogonal or Y direction in the overlying layer. Power plane patterns of conductive material are used to control the impedance between two or more signal plane patterns and to simultaneously disperse the voltage across the area of the substrate for the purpose of powering the semiconductor devices mounted on the top surface. In this improved process, the power plane patterns are formed in the manner described previously in order to increase the ceramic to ceramic contact between the sheet supporting the power plane pattern configuration and the overlying sheet. The various green ceramic sheets with the signal patterns and the green ceramic sheets with the power plane patterns are assembled, pressed to remove any entrapped air between the sheets and form a firm contact between the various metallized areas, and the resultant assembly sintered at a temperature sufficient to burn off the organic binder in the green ceramic material and subsequently fuse the ceramic particles into the monolithic body. During the sintering operation the substrate experiences a significant reduction in size due to shrinkage. Upon cooling, the substrates are plated with appropriate metals to define a surface pattern and one or more semiconductor device mounted and joined on the top surface. Pins or other suitable I/O connections are joined to the bottom surface to make connection to the internal metallurgy of the multilayer ceramic substrate. The resultant substrate embodying the power plane configuration described hereinbefore eliminates or minimizes separation of the green ceramic sheets of the substrate during the sintering operations.

We claim:

1. In an improved semiconductor device package having a sintered multilayer ceramic substrate formed of laminated ceramic sheets, at least one integrated circuit semiconductor device mounted on the top surface of the substrate, I/O conductions on the bottom surface of the substrate, and an internal metallurgy system formed of printed conductive circuit patterns and filled vias on and in the sheets, the improvement comprising:

a plurality of improved design large area conductive metal planes supported on ceramic sheets included in said metallurgy system, the conductive pattern including small areas surrounding a rectangular grid of via holes, a substantially solid central area of conductive meal occupying not more than 60% of the total area of the supporting sheet, and broad stripes emanating from said central area, said conductive pattern in use maximizing the ceramic to ceramic interface areas between the ceramic sheet supporting the conductive metal plane and the adjacent ceramic sheet.

2. The package of claim 1 wherein additional open areas are provided in said central area to further increase the ceramic to ceramic contact, said additional open areas being larger in area than said areas surrounding the via holes.

3. The package of claim 1 wherein a plurality of devices are mounted on said substrate, said devices located in the central portion of the substrate leaving the border area open.

* * * * *